(12) United States Patent
Theron et al.

(10) Patent No.: US 7,496,820 B1
(45) Date of Patent: Feb. 24, 2009

(54) METHOD AND APPARATUS FOR GENERATING TEST VECTORS FOR AN INTEGRATED CIRCUIT UNDER TEST

(75) Inventors: Conrad A. Theron, San Jose, CA (US); Michael L. Simmons, Monte Sereno, CA (US); Walter H. Edmondson, Morgan Hill, CA (US); Mihai G. Statovici, Santa Barbara, CA (US)

(73) Assignee: Xilinx, Inc., San Jose, CA (US)

( * ) Notice: Subject to any disclaimer, the term of this patent is extended or adjusted under 35 U.S.C. 154(b) by 413 days.

(21) Appl. No.: 11/369,670

(22) Filed: Mar. 7, 2006

(51) Int. Cl.
*G06F 11/00* (2006.01)

(52) U.S. Cl. .................... 714/738; 714/742; 714/725; 714/726; 714/727; 714/25; 714/724; 714/741; 716/4; 716/5; 716/16; 716/17; 716/18; 703/15; 703/20

(58) Field of Classification Search .............. None
See application file for complete search history.

(56) References Cited

U.S. PATENT DOCUMENTS

| | | | |
|---|---|---|---|
| 6,341,361 B1 * | 1/2002 | Basto et al. ............. 714/726 |
| 7,137,087 B1 * | 11/2006 | Mohanty et al. ............. 716/5 |
| 7,373,621 B1 * | 5/2008 | Dastidar ............. 716/4 |
| 2002/0173942 A1 * | 11/2002 | Rajsuman et al. ............. 703/14 |
| 2004/0153928 A1 * | 8/2004 | Rohrbaugh et al. ......... 714/738 |
| 2004/0187060 A1 * | 9/2004 | Rohrbaugh et al. ......... 714/742 |
| 2004/0250191 A1 * | 12/2004 | Leaming ............. 714/742 |

* cited by examiner

*Primary Examiner*—John P Trimmings
(74) *Attorney, Agent, or Firm*—Robert M. Brush

(57) ABSTRACT

Method, apparatus, and computer readable medium for generating test vectors for an integrated circuit (IC) under test is described. In one example, a test function is specified using at least one elementary function that encapsulates program code associated with an architecture of the IC under test. An engine is configured with device description data for the IC under test. The engine is executed with the test function as parametric input to generate the test vectors. In one example, the IC under test comprises a programmable logic device (PLD) and the test vectors include configuration data for configuring a pattern in the PLD and at least one test vector for exercising the pattern. The test vectors may be applied directly to the device or through automatic test equipment (ATE). Alternatively, the test vectors may be applied to a IC design simulation of the device.

20 Claims, 3 Drawing Sheets

METHOD AND APPARATUS FOR GENERATING TEST VECTORS FOR AN INTEGRATED CIRCUIT UNDER TEST

CROSS-REFERENCE TO A COMPUTER PROGRAM LISTING APPENDIX

This application includes a computer program listing appendix on a single compact disc, the contents of which are incorporated herein by reference. The compact disc contains a first 407 KB file entitled "ELEMENT1.TXT", a second 129 KB file entitled "USER1.TXT", a third 6 KB file entitled "VE1.TXT", and a fourth 6 KB file entitled "HELPER1.TXT", each of which were created on Mar. 7, 2006. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more aspects of the present invention relate generally to testing integrated circuits and, more particularly, to a method and apparatus for generating test vectors for an integrated circuit under test.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An important step in the manufacture of ICs such as PLDs is testing microchips prior to shipment to a customer. Presently, testing is performed by applying input stimuli in the form of test vectors to inputs of the device under test (DUT). The test vectors are typically strings of binary digits designed to exercise desired circuitry within the PLD. During the test, output of the DUT is recorded and compared with expected output for the test vectors. Conventionally, engineers create test vectors by hand by setting each bit in the vectors. Such manual creation of test vectors is time consuming and error prone. Accordingly, there exists a need in the art for an improved method and apparatus for generating vectors for an integrated circuit under test.

In addition, the ability to verify an IC design is also an important part of the design process. Each IC design in a logic type device must be simulated to insure that the logic performs as designed. Engineers currently divide a complete IC into sections by circuit and then create simulation vectors by hand for each component of the circuitry. This is time consuming and error prone, but this is a required step in order to insure quality and prevent costly repair of the IC device. Accordingly, there exists a need in the art to provide an automated approach to simulate the entire IC.

SUMMARY OF THE INVENTION

Method, apparatus, and computer readable medium for generating test and simulation vectors for an integrated circuit (IC) under test is described. In one embodiment, a test function is specified using at least one elementary function that encapsulates program code associated with an architecture of an IC under test. An engine is configured with device description data for the IC under test. The engine is executed with the test function as parametric input to generate the test vectors. In one embodiment, the IC under test comprises a programmable logic device (PLD) and the test vectors include configuration data for configuring a pattern in the PLD and at least one test vector for exercising the pattern. The test vectors may be applied directly to the device or through automatic test equipment (ATE). Alternatively, the test vectors may be applied to a design simulation of the device.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method, apparatus, and computer readable medium for generating test and simulation vectors for an integrated circuit (IC) under test is described. One or more aspects of the invention are described with respect to generation and application of test vectors to a programmable logic device (PLD), such as a complex programmable logic device (CPLD) or a field programmable gate array (FPGA). Those skilled in the art will appreciate that the invention may be adapted to generate test vectors for other types of ICs, such as application specific integrated circuits (ASICs), application specific standard products (ASSPs), and the like.

In one embodiment, a description of the type of testing desired is produced using a set of high-level programming constructs. The high-level programming constructs encapsulate lower-level program code for configuring a particular PLD for the type of testing. The description is converted to test vectors, which include configuration and programming vectors for implementing a test pattern in the device, functional vectors to be applied to the test pattern, and information for toggling the functional vectors.

Figure 1:
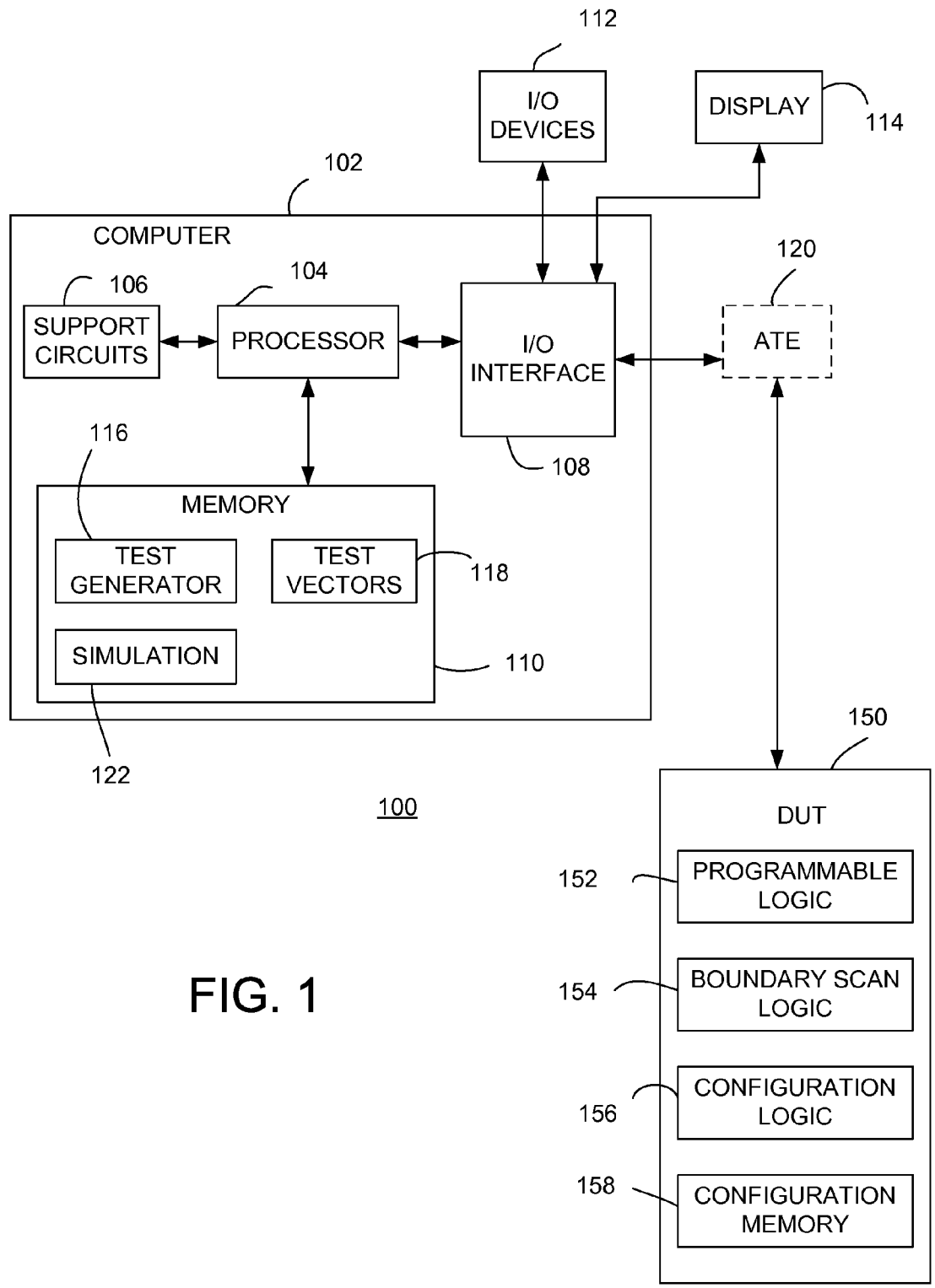
FIG. 1 is a block diagram depicting an exemplary embodiment of a system for testing an IC under test in accordance with one or more aspects of the invention.

FIG. 1 is a block diagram depicting an exemplary embodiment of a system 100 for testing an IC under test in accordance with one or more aspects of the invention. The IC under test is referred to as the device under test (DUT). The system includes a computer 102 in communication with a DUT 150. The computer 102 is configured to produce data for testing the DUT 150 ("test vectors"). The DUT 150 is a PLD having programmable logic 152, boundary scan logic 154, configuration logic 156, and configuration memory 158. The programmable logic 152 comprises an array of programmable blocks interconnected by a programmable routing structure. The programmable logic 152 is programmed by loading configuration data into the configuration memory 158 under control of the configuration logic 156. The boundary scan logic 154 includes logic for performing standard tests of the DUT 150. For example, the boundary scan logic 154 may comport with IEEE 1149.1 (referred to as JTAG). The configuration data may be loaded into the DUT 150 via the boundary scan logic 154. Alternatively, the DUT 150 may include a separate configuration access port (CAP) for receiving such configuration data (not shown).

For example, in an FPGA, the programmable logic 152 typically includes an array of programmable tiles. The programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and the like. Each programmable tile includes both programmable interconnect and programmable logic. The programmable interconnect typically includes a large number of interconnect lines of varying lengths interconnected by programmable interconnect points (PIPs). The programmable logic implements the logic of a design using programmable elements that can include, for example, function generators, registers, arithmetic logic, and the like. The programmable interconnect and programmable logic are typically programmed by loading a stream of configuration data into internal configuration memory cells of the configuration memory 158 that define how the programmable elements are configured.

In another example in a CPLD, the programmable logic 152 includes function blocks connected together and to input/output (I/O) resources by an interconnect switch matrix. Each function block may include a two-level AND/OR structure similar to those used in Programmable Logic Arrays (PLAs) and Programmable Array Logic (PAL) devices. In some CPLDs, the configuration memory 158 comprises on-chip non-volatile memory.

The computer 102 includes a processor 104, support circuits 106, an input/output (I/O) interface 108, and a memory 110. The processor 104 may be any type of microprocessor known in the art. The support circuits 106 for the processor 104 include conventional cache, power supplies, clock circuits, data registers, I/O interfaces, and the like. The I/O interface 108 may be directly coupled to the memory 110 or coupled through the processor 104. The I/O interface 108 may be coupled to various I/O devices 112, such as a conventional keyboard, mouse, printer, and the like, as well as a display 114 and the DUT 150. The memory 110 may include one or more of the following random access memory, read only memory, magneto-resistive read/write memory, optical read/write memory, cache memory, magnetic read/write memory, and the like, as well as signal-bearing media as described below. The computer 102 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 110.

The memory 110 stores program code for implementing a test generator 116. The test generator 116 is configured to generate test vectors 118 for the DUT 150 in response to user input. The test vectors 118 include stimulus data and expected output data. In one embodiment, the test vectors 118 are configured to be manually applied to the DUT 150 through automatic test equipment (ATE) 120. As is well known in the art, ATE includes various circuits for applying and receiving signals to a DUT for the purpose of testing the DUT, as well as comparing the received signals to the expected results. The test vectors 118 may be included in a file that is loaded into the ATE 120 for application to the DUT 150. The ATE 120 then outputs the results of the test (e.g., the results may be in an electronic file and/or a hard-copy printout). In another embodiment, the test vectors 118 may be applied to the DUT 150 using manual bench testing equipment.

In another embodiment, the test generator 116 is further configured to apply the test vectors 118 to the DUT 150 through the I/O interface 108. For example, the test generator 116 may automatically apply the test vectors 118 to the ATE 120 via the I/O interface 108 (e.g., using a serial interface, parallel interface, universal serial bus (USB) interface, and the like). The ATE 120 then outputs the results of the test.

In yet another embodiment, the test generator 116 is further configured to apply the test vectors 118 to the DUT 150 and receive result data produced by the DUT 150 in response to the test vectors 118 via the I/O interface 108. For example, the ATE 120 may return result data to the computer 102 via the I/O interface 108 for display via the display 114. In another example, the test vectors 118 are applied directly to the DUT 150 via the I/O interface 108 (i.e., the ATE 120 is omitted). The test vectors 118 may be applied to the DUT 150 directly through pins of the package of the DUT 150 (if packaged) or pads of the die of the DUT 150. That is, parallel test vectors may be applied to input pins/pads of the DUT 150 associated with the circuitry being tested. Result data may be captured from the appropriate output pins/pads in accordance with the particular test vectors and shown on the display 114.

Alternatively, the test vectors 118 may comprise boundary scan test vectors that may be applied to the DUT 150 via boundary scan pins/pads of the DUT 150 (e.g., JTAG pins/pads). Result data may be captured from the boundary scan output pin/pad and shown on the display 114. In yet another example, the test vectors 118 are applied to a simulation of the DUT 150, rather than, or in addition to, being applied to the DUT 150. Notably, the computer 102 may be configured to execute a simulation 122 of the DUT 150. The simulation 122 uses the test vectors 118 as parametric input to produce result data, which is shown on the display 114. In this embodiment, the computer 102 need not be connected to the DUT 150 (i.e., an actual DUT is not present, but is rather simulated using a device model that includes an engine to simulate the function and behavior of the target device).

Figure 2:
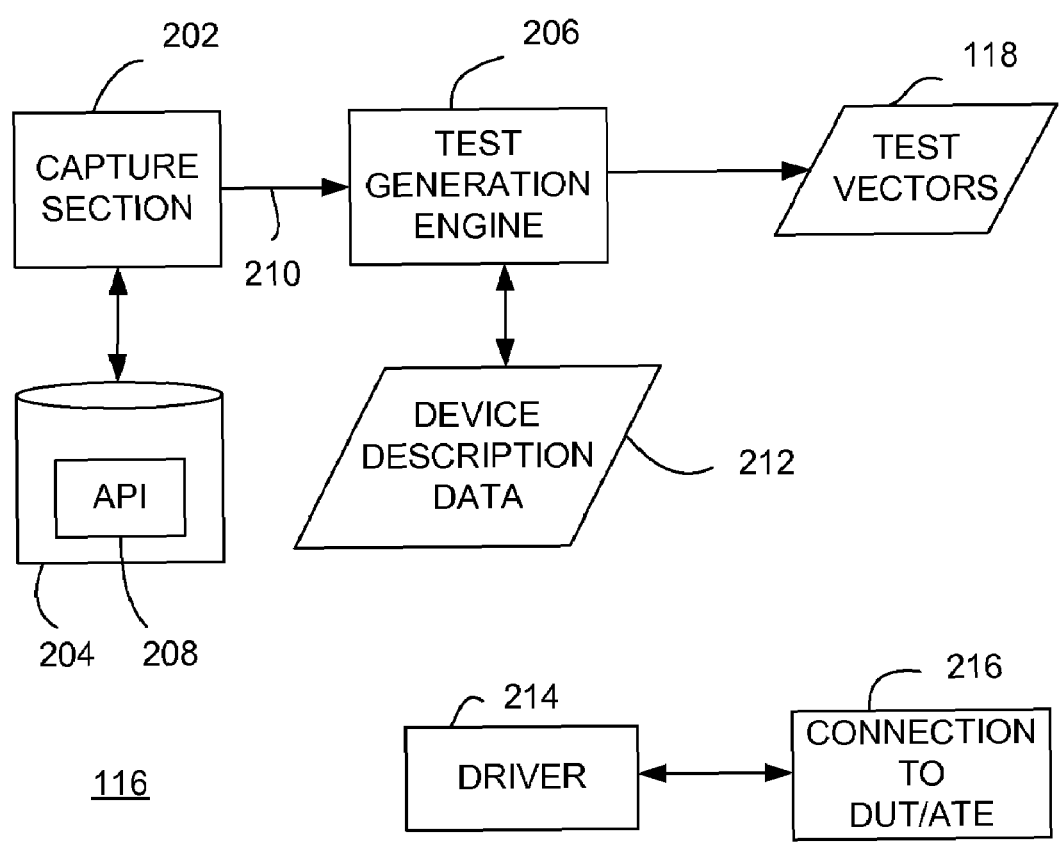
FIG. 2 is a block diagram depicting an exemplary embodiment of a test generator in accordance with one or more aspects of the invention.

FIG. 2 is a block diagram depicting an exemplary embodiment of the test generator 116 in accordance with one or more aspects of the invention. In one embodiment, the test generator 116 includes a capture section 202, a database 204, and a test generation engine 206. The database 204 stores an application programming interface (API) 208. The API 208 includes a set of execution units ("elementary functions" or "user functions") that encapsulate program code associated with the architecture of the DUT 150. The program code describes or embodies the architecture of at least a portion of the DUT, such as boundary scan architecture, programmable logic architecture (e.g., macrocell, universal interconnect matrix, FPGA logic cell arrays, and like type elementary building blocks discussed above), and pin/pad architecture. For example, the API 208 may include elementary functions for configuring programmable logic of the DUT 150, loading configuration data into the DUT 150, and toggling pins/pads of the DUT 150. Exemplary elementary functions written in the C programming language are included in the file ELEMENT1.TXT of the computer program appendix. The elementary functions of the API 208 encapsulate away the specific details of device architecture and provide a generic set of functions for a test engineer to use to generate test vectors for any type of device.

For example, if a test engineer desires to configure the device as an inverter (i.e., a signal applied to an input is logically inverted at the output), the test generation engine 206 generates vectors to configure the device as an inverter. The test engineer need only specify the function (i.e., inverting) and the input and output pins of the device. This is accomplished without the test engineer needing to know any details on how to configure the device as an inverter, or anything about the internal path of the signal through the device. Due to the nature of PLDs, the same inverter function can be implemented in many ways. As such, if the test engineer desires that the inverter follow a particular path through the device, the test engineer can also cause the test generation engine 206 to generate that specific configuration in the device.

The capture section 202 is configured to capture input from a user to generate an execution unit for testing the DUT 150 ("test function 210"). The test function 210 calls one or more elementary functions in the API 208 to perform specific tests on the DUT 150. In one embodiment, the test function 210 includes calls to elementary functions for configuring programmable logic of the DUT 150 to produce at least one test pattern, loading configuration data into the DUT 150 to implement the test pattern(s), applying signals to various pins/pads of the DUT 150, and toggling such signals. For example, a user may write a test function to generate the configuration pattern for an inverter, counter, shift register, multiplexer, or like type logic function. The test function may also be written to take such a pattern and "write" it into the device through the JTAG port, for example. The test function may be further extended to support testing vectors or stimulus specific to the logic pattern described therein. The test function may be further broadened to take the test vectors and apply them to the pattern through the JTAG port (e.g., using JTAG INTEST instruction) and read or compare the results. Furthermore, the test function can be extended to create another slightly different configuration pattern, with corresponding test vectors, and be instructed to only configure into the device the difference between the first and the second pattern (i.e., some PLDs allow for partial reconfiguration) and then test that new configuration with the new test vectors. In another example, a user may write a test function to perform various JTAG tests, such as an IDCODE test, a USERCODE test, EXTESTs, INTESTs, and the like. Exemplary user functions written in the C programming language are included in the file USER1.TXT of the computer program appendix.

The test generation engine 206 is configured to produce the test vectors 118 for testing the DUT 150. The test vectors 118 may include configuration and programming vectors for implementing at least one test pattern in the device, functional vectors to be applied to the test pattern(s), and information for toggling the functional vectors. In one embodiment, the test vectors 118 include configuration data for a plurality of test patterns. The configuration data includes data for configuring a first pattern, incremental data for reconfiguring the first pattern to the second pattern, incremental data for reconfiguring the second pattern to the third pattern, and so on. The "incremental data" is configuration data adapted to enable partial reconfiguration of the programmable logic 152, such partial reconfiguration being well known in the art. The test generation engine 206 is configured with device description data 212 for the DUT 150. The device description data 212 includes information that describes the architecture of the particular device. For example, the device description data 212 may include information from a boundary scan description language (BSDL) representation of the DUT 150, package pin to bonded pad information, speed files describing the speed paths in the device, and the like. Once configured, the test generation engine 206 is executed using the test function as parametric input to produce the test vectors 118. An exemplary test generation engine written in the C programming language is included in the file VE1.TXT of the computer program appendix. In one embodiment, the test generator 116 further includes a driver 214 for handling communication over a connection 216 to the DUT 150 or ATE 120 for applying test vectors and receiving result data.

In one embodiment, the test generation engine 206 is configured with the device description data 212 automatically using one or more helper programs. The helper programs automatically parse out the device descriptions from the device description data 212 and embed that information info the test generation engine 206. Exemplary helper programs written in the PERL language are shown in the file HELPER1.TXT of the computer program appendix.

Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

Figure 3:
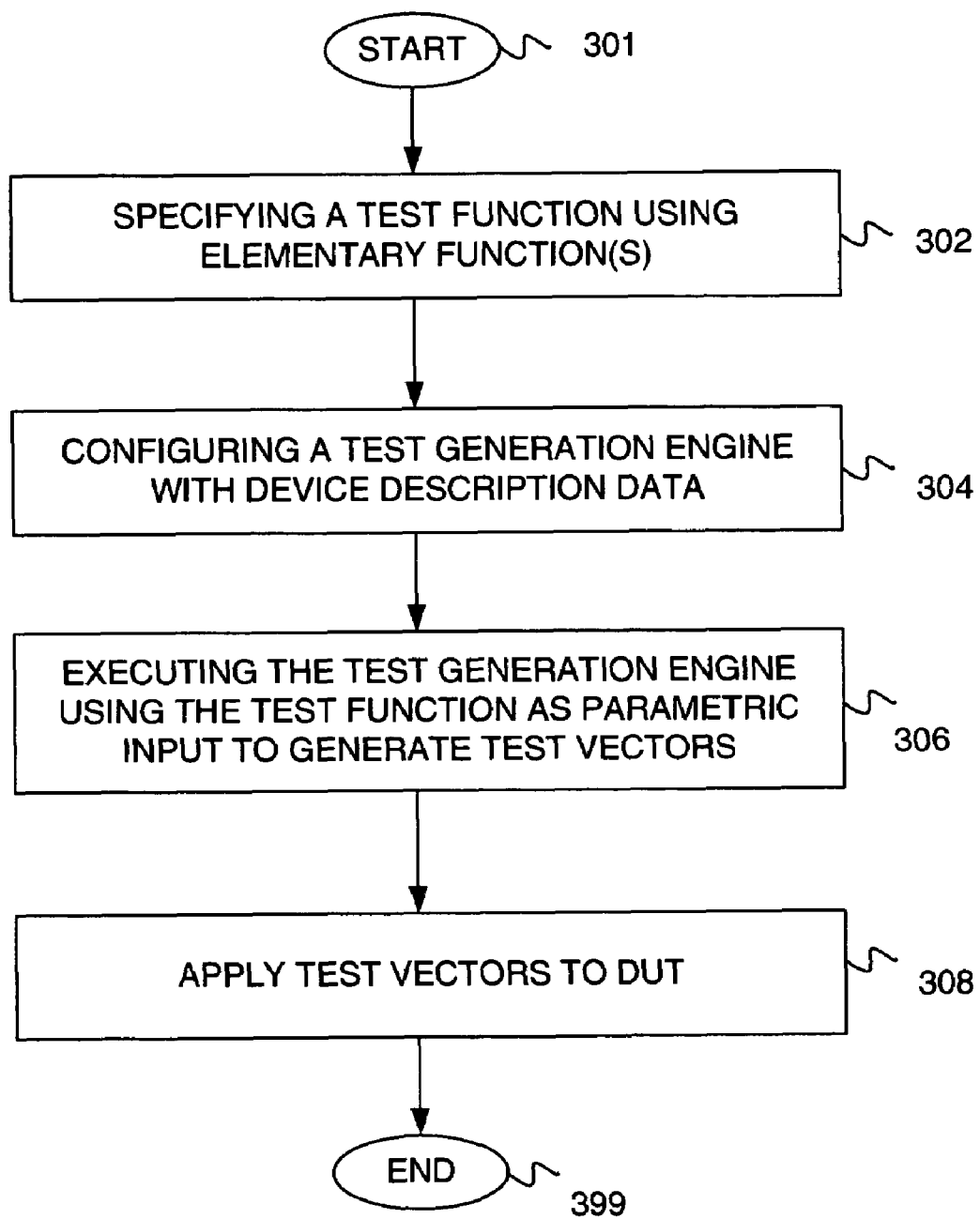
FIG. 3 is a flow diagram depicting an exemplary embodiment of a method for generating test vectors for a device under test (DUT) in accordance with one or more aspects of the invention.

FIG. 3 is a flow diagram depicting an exemplary embodiment of a method 300 for generating test data for a device under test (DUT) in accordance with one or more aspects of the invention. The method 300 begins at step 301. At step 302, a test function is specified using one or more elementary functions. The elementary functions are part of an API that encapsulates program code associated with the architecture of the DUT. At step 304, a test generator engine is configured with description data for the DUT. At step 306, the test generator engine is executed using the test function as parametric input to produce the test vectors. At step 308, the test vectors are applied to the DUT. The method 300 ends at step 399.

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); and (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of generating test vectors for an integrated circuit (IC) under test, comprising:

specifying a test function using at least one elementary function that encapsulates program code associated with an architecture of the IC under test, the at least one elementary function selected to: configure programmable logic of the IC under test with at least one pattern; and test the IC configured with the at least one pattern;

configuring an engine with device description data for the IC under test; and executing the engine with the test function as parametric input to generate the test vectors, the test vectors including configuration data for configuring the at least one pattern in the IC under test and at least one test vector for exercising the IC configured with the at least one pattern.

2. The method of claim 1, further comprising:

applying the test vectors to the IC under test to obtain result data.

3. The method of claim 2, wherein the step of applying comprises:

coupling the test vectors to the IC under test through a connection accessible by the engine.

4. The method of claim 3, wherein the test vectors comprises at least one parallel test vector, and wherein the at least one parallel test vector is applied via pins or pads of the IC under test.

5. The method of claim 3, wherein the test vectors comprises at least one boundary scan test vector, and wherein the at least one boundary scan test vector is applied via boundary scan pins or pads of the IC under test.

6. The method of claim 2, wherein the step of applying comprises:

coupling the test vectors to automatic test equipment (ATE) or manual bench testing equipment configured to test the IC under test.

7. The method of claim 1, further comprising:

performing an IC design simulation of the IC under test using the test vectors as parametric input.

8. The method of claim 1, wherein the device description data comprises at least one of: (a) a boundary scan description language (BSDL) representation of the IC under test; (b) package pin to bonded pad information for the IC under test; or (c) speed files describing speed paths in the IC under test.

9. The method of claim 1, wherein the IC under test comprises a programmable logic device (PLD).

10. The method of claim 9, wherein the at least one pattern comprises a first pattern and a second pattern, wherein the configuration data includes data for configuring the first pattern and incremental data for reconfiguring the first pattern to the second pattern, and wherein the at least one test vector includes one or more test vectors for testing the IC configured with the first pattern and one or more test vectors for the second pattern.

11. The method of claim 9, wherein the PLD comprises a complex programmable logic device (CPLD) or a field programmable gate array (FPGA).

12. Apparatus for generating test vectors for an integrated circuit (IC) under test, comprising:

an input interface for specifying a test function using at least one elementary function that encapsulates program code associated with an architecture of the IC under test, the at least one elementary function selected to: configure programmable logic of the IC under test with at least one pattern; and test the IC configured with the at least one pattern; and a processor for configuring an engine with device description data for the IC under test and executing the engine with the test function as parametric input to generate the test vectors, the test vectors including configuration data for configuring the at least one pattern in the IC under test and at least one test vector for exercising the IC configured with the at least one pattern.

13. The apparatus of claim 12, further comprising:

an output interface for coupling the test vectors to the IC under test to obtain result data.

14. The apparatus of claim 12, further comprising:

an output interface for providing a file having the test vectors for use by automatic test equipment (ATE) or manual bench testing equipment configured to test the IC under test.

15. The apparatus of claim 12, further comprising:

means for providing a file having the test vectors as parametric input for a simulator for simulating the IC under test.

16. The apparatus of claim 12, wherein the IC under test comprises a programmable logic device (PLD).

17. The apparatus of claim 16, wherein the at least one pattern comprises a first pattern and a second pattern, wherein the configuration data includes data for configuring the first pattern and incremental data for reconfiguring the first pattern to the second pattern, and wherein the at least one test vector includes one or more test vectors for testing the IC configured with the first pattern and one or more test vectors for testing the IC configured with the second pattern.

18. A computer readable medium having stored thereon software for generating test vectors for an integrated circuit (IC) under test, the software comprising:

code for specifying a test function using at least one elementary function that encapsulates program code associated with an architecture of the IC under test, the at least one elementary function selected to: configure programmable logic of the IC under test with at least one pattern; and test the IC configured with the at least one pattern;

code for configuring an engine with device description data for the IC under test; and code for executing the engine with the test function as parametric input to generate the test vectors, the test vectors including configuration data for configuring the at least one pattern in the IC under test and at least one test vector for exercising the IC configured with the at least one pattern.

19. The computer readable medium of claim 18, further comprising:

code for coupling the test vectors to the IC under test to obtain result data.

20. The computer readable medium of claim 18, wherein the IC under test comprises a programmable logic device (PLD).

* * * * *